(12) United States Patent
Quek et al.

(10) Patent No.: US 7,795,104 B2
(45) Date of Patent: Sep. 14, 2010

(54) METHOD FOR FABRICATING DEVICE STRUCTURES HAVING A VARIATION IN ELECTRICAL CONDUCTIVITY

(75) Inventors: Elgin Kiok Boone Quek, Singapore (SG); Lee Wee Teo, Singapore (SG); Shyue Seng Tan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 157 days.

(21) Appl. No.: 12/030,598

(22) Filed: Feb. 13, 2008

(65) Prior Publication Data

US 2009/0203185 A1    Aug. 13, 2009

(51) Int. Cl.
*H01L 21/20*    (2006.01)
(52) U.S. Cl. .................. 438/385; 438/382; 438/795; 257/E21.004
(58) Field of Classification Search .................. 438/382, 438/385, 795; 257/E21.004
See application file for complete search history.

(56) References Cited

U.S. PATENT DOCUMENTS

| 6,551,888 | B1 * | 4/2003 | Tabery et al. ............... 438/308 |
| 7,109,087 | B2 | 9/2006 | Autryve et al. |
| 7,166,904 | B2 | 1/2007 | Gill et al. |
| 7,236,916 | B2 | 6/2007 | Pierrat et al. |
| 2005/0082536 | A1 * | 4/2005 | Park et al. ...................... 257/72 |
| 2005/0127436 | A1 * | 6/2005 | Henson et al. ............... 257/327 |
| 2005/0287771 | A1 * | 12/2005 | Seamons et al. ............ 438/482 |
| 2007/0072382 | A1 * | 3/2007 | Yamamoto et al. .......... 438/305 |

\* cited by examiner

*Primary Examiner*—Thanh V Pham
*Assistant Examiner*—Maria Ligai
(74) *Attorney, Agent, or Firm*—Brinks Hofer Gilson & Lione

(57) ABSTRACT

A method for forming device structures having a variation in electrical conductivity includes forming a device structure and a radiation absorbing layer overlying the device structure. The radiation absorbing layer has a spatial variation and radiation absorbing characteristics, such that upon irradiating the device structure, the radiation absorbing layer attenuates the intensity of the radiation so that a variation in dopant activation takes place within the device structure. Accordingly, device structures are formed having a variation in electrical resistance independent of the physical size of the device structures.

24 Claims, 5 Drawing Sheets

METHOD FOR FABRICATING DEVICE STRUCTURES HAVING A VARIATION IN ELECTRICAL CONDUCTIVITY

TECHNICAL FIELD

The invention relates, generally, to methods for fabricating semiconductor devices and, more particularly, to the fabrication of device structures having predetermined electrical conductivity, such as resistors and transistor components.

BACKGROUND

The fabrication of semiconductor devices involves the sequential formation of device structures in accordance with a particular layout design. Typically, semiconductor devices, such as integrated circuits, memory devices, and the like, are fabricated according to design rules that are continually reduced in order to provide high-speed, high-density devices on a semiconductor substrate. Accordingly, the various components of the device are designed to have extremely small feature sizes. Further, the various components are packed together as tightly as possible to avoid consuming excessive substrate surface area.

Despite the need to reduce the feature size of device components, certain components, such as sheet resistors, and the like, depend on feature size to determine their electrical conductivity. For example, sheet resistors are typically laid out to have a resistance that corresponds to the length and width dimensions of the resistor on the substrate surface. Typically, to fabricate sheet resistors, a patterned semiconductor body, such as polycrystalline silicon, is formed on the substrate and implanted with conductivity-determining dopants to set the electrical resistance of the resistors. The electrical resistance of the sheet resistors will vary in accordance with the dimensions of the semiconductor body. Thus, a large amount of substrate surface area can be needed to obtain a predetermined resistance level.

The component density restrictions imposed by sheet resistors are particularly significant where block resistors, such as, electrostatic-discharge-protection (ESD) resistors are included. These resistors, otherwise known as unsilicided resistors, are situated over active portions of a metal-oxide-semiconductor (MOS) device. The unsilicided resistors are typically formed between the gate electrode and the source and drain region of the MOS transistors. In this configuration, the block resistors take up valuable semiconductor surface area in regions of the device that require the formation of high-density device structure.

Where the resistivity is set by resistor doping, efficient device fabrication requires that a minimal number of special processing steps be used to fabricate the resistors. To maintain high process efficiency, the resistors are typically doped at the same time as other device structures during the fabrication process. The fabrication process seeks maximum dopant activation in order to maximize the performance of other implanted device components, such as transistors, and the like. Maximum dopant activation, however, results in very low sheet resistance values in the doped resistors, which are often not optimal for various types of resistors, such as unsilicided resistors.

Further improvements in device fabrication methods are necessary to provide device structures, such as resistors, and transistors, that have electrical conductivities independent of their feature size.

SUMMARY

In one embodiment, a method for fabricating a semiconductor device includes forming a device structure. A radiation absorbing layer is formed overlying the device structure, where the radiation absorbing layer has a variation in absorbance. The device structure is irradiated and the radiation absorbing layer imparts a variation in electrical conductivity of the device structure that substantially corresponds to the variation in absorbance.

In another embodiment, a method for forming device structures having a variation in electrical conductivity includes forming a plurality of device structures having substantially the same area of dimensions. A radiation absorbing layer having a variation in absorbance is formed overlying the device structures. Electrical conductivity is imparted to the device structures where the electrical conductivity of at least two device structures differs in accordance with the variation in absorbance of the radiation absorbing layer.

In yet another embodiment, a method of fabricating resistors includes defining resistors on a semiconductor substrate. A radiation absorbing layer having a variation in absorbance is formed overlying the resistors. The resistors are irradiated through the radiation absorbing layer where the electrical resistivity of the resistors varies in substantial correspondence with the variation and absorbance of the radiation absorbing layer.

DETAILED DESCRIPTION

Figure 1:
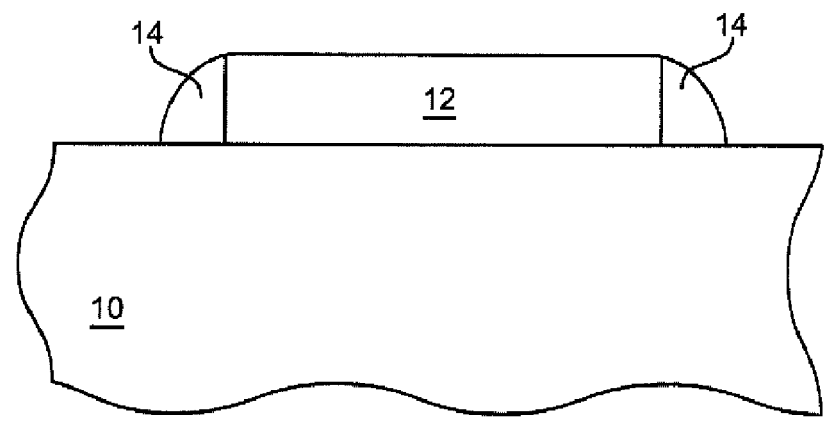
FIGS. 1-3 illustrate, and cross-section, processing steps in accordance with one embodiment of the invention.

Illustrated in FIG. 1, in cross-section, is a portion of a substrate 10 having already undergone several processing steps in accordance with an embodiment of the invention. A device structure 12 overlies substrate 10 and includes sidewall spacers 14 adjacent to the edges of device structure 12. In one embodiment, device structure 12 is a resistor formed by depositing polycrystalline silicon on substrate 10, followed by forming a lithographic pattern on the polycrystalline silicon and etching the polycrystalline silicon to form a resistor pattern on substrate 10. Sidewall spacers 14 can be formed by conformally depositing an insulating material and anisotropically etching the insulating material. Where device structure 12 is a resistor, substrate 10 can be an insulating region of a semiconductor substrate, such as an isolation region formed in a portion of the semiconductor substrate. Further, the portion of substrate 10 illustrated in FIG. 1 can be a single-crystal silicon substrate region.

Those skilled in the art will appreciate that the following process can be carried out to form a variety of device components, such as gate electrodes, capacitor plates, and the like. In an alternative embodiment, device structure 12 can be a portion of an MOS transistor, such as a gate electrode or a capacitor plate, or the like. Where device structure 12 is a gate electrode, for example, substrate 10 will also include a gate dielectric layer (not shown) separating device structure 12 from substrate 10. Although a number of different device structures can benefit from processing carried out in accordance with the invention, the following description relates to the formation of sheat resistors, such as unsilicided resistors used for ESD protection in a semiconductor device.

Once device structure 12 is formed, a doping process is carried out to introduce conductivity-determining dopants into device structure 12. The doping process can be specifically configured to dope device structure 12, or the doping process can be performed in conjunction with the doping of other device structures or substrate regions.

Figure 2:
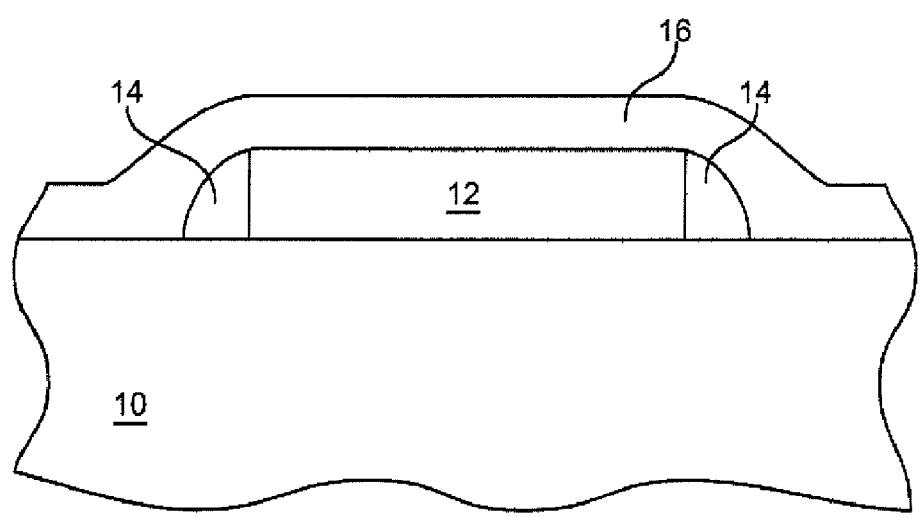

After forming device structure 12, a radiation absorbing layer 16 is deposited to overlie device structure 12, as illustrated in FIG. 2. Radiation absorbing layer 16 is preferably conformally deposited to provide a uniformly thick layer overlying device structure 12 and the remaining regions of substrate 10. Radiation absorbing layer 16 can be a number of different materials having the capability to absorb radiation impinging upon the upper surface of layer 16. For example, radiation absorbing layer 16 can be an amorphous carbon layer that is impregnated with hydrogen. Further, layer 16 can be a carbon-hydrogen layer that further includes additional species, such as nitrogen, boron, phosphorus, fluorine, and combinations of these species.

In one embodiment, radiation absorbing layer 16 is deposited by a chemical-vapor deposition (CVD) process. The CVD process can be a plasma-enhanced CVD process (PECVD) in which the deposition takes place in a plasma reactor. In addition to CVD and PECVD, layer 16 can be deposited by a physical-deposition-process (PVD), such as sputtering, reactive sputtering, and the like.

In accordance with an aspect of the invention, radiation absorbing layer 16 can be utilized in connection with the fabrication of additional device components during a semiconductor device fabrication process. For example, radiation absorbing layer 16 can be an etch-stop layer in which layer 16 provides a protective function to underlying materials during subsequent etching processes carried out in the device fabrication process. Further, radiation absorbing layer 16 can be an anti-reflective coating used in a lithographic patterning process. Accordingly, the process of the invention can be integrated with additional semiconductor device processing steps, such that the radiation absorbing layer performs a variety of different functions. In this way, the inventive process can be fully integrated into a variety of device fabrication processes without requiring additional or special processing steps beyond those already used in a device fabrication process.

Figure 3:
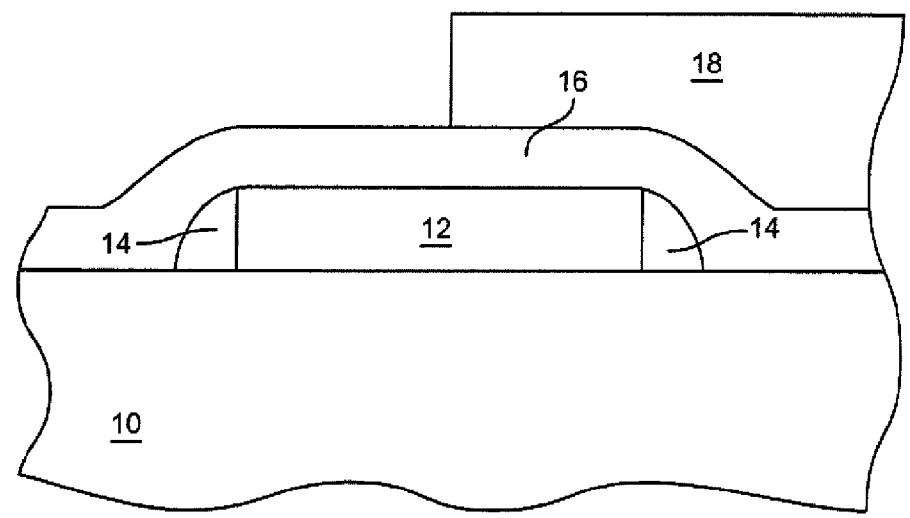
Figure 4:
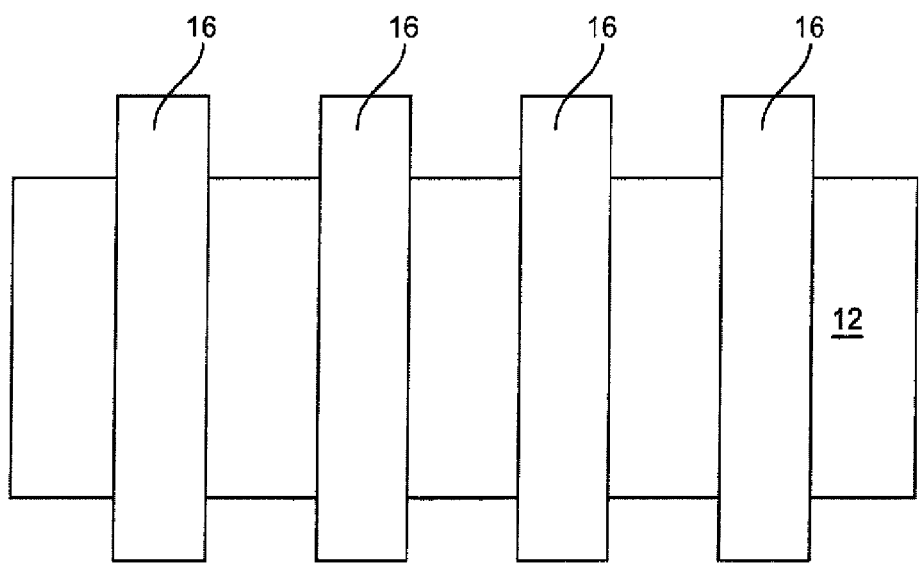
FIG. 4 illustrates a plain view of a resistor configuration in accordance with an embodiment of the invention.

Referring to FIG. 3, a lithographic mask 18 is formed to overlie a portion of radiation absorbing layer 16. Lithographic mask 18 can be formed in a wide variety of configurations depending upon the desired configuration of the unsilicided resistors. For example, one possible configuration is illustrated in the plain view of FIG. 4. Upon removal of the portions of device structure 12 exposed by lithographic mask 18, a series of rectangular-shaped resistors will be formed on substrate 10.

Those skilled in the art will appreciate that unsilicided resistors having a wide variety of geometric configurations can be formed by the lithographic patterning and etching process described above. For example, in addition to rectangular block resistors, circular resistors, serpentine patterns, a resistor block having a plurality of voids, and the like, can be formed. Further, although not illustrated in FIGS. 3 and 4, the unsilicided resistors can be formed over a wide variety of existing device structures, such as MOS transistors, isolation regions, electrical interconnect structures, and the like. Additionally, the unsilicided resistors can be fabricated in peripheral areas of an integrated circuit device, or memory device, or the like.

Depending upon the particular pattern of radiation absorbing layer 16 and the particular type of subsequent processing, a variety of electrical resistance values can be imparted to device structure 12. In one embodiment, the electrical resistance of device structure 12 will depend upon the total percentage of aerial coverage provided by radiation absorbing layer 16. In the embodiment illustrated in FIG. 4, a repeated array of mask islands can be formed that defines the percentage area of the resistor covered by radiation absorbing layer 16. Because the final electrical resistance of device structure 12 is determined by the percentage of device structure 12 covered by radiation absorbing layer 16, the process is not dependent upon the precise alignment of lithographic mask 18. Those skilled in the art will appreciate that this aspect of the invention further increases the utilization of the inventive process in a variety of semiconductor device fabrication processes.

Figure 5:
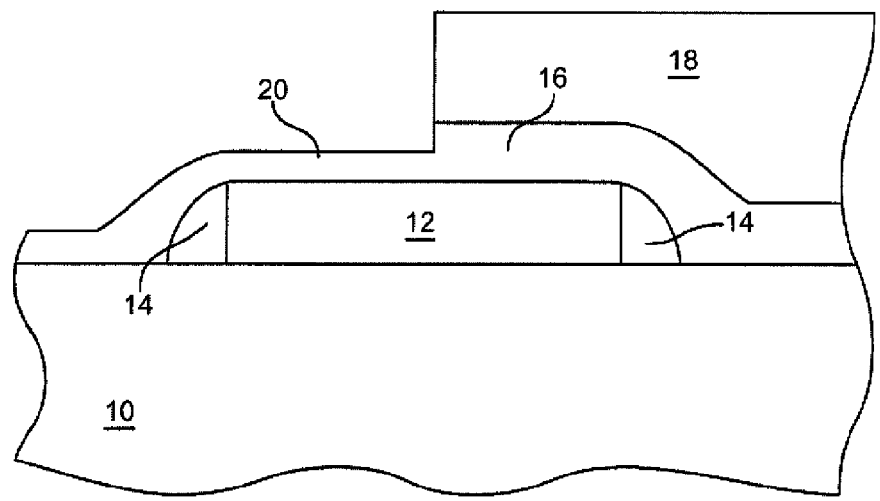
FIGS. 5-8 illustrate, and cross-section, further processing steps of the embodiment illustrated in FIGS. 1-4.

In the process described above, after forming lithographic mask 18, exposed portions of radiation absorbing layer 16 were completely etched to expose the upper surface of device structure 12 underlying the etched portions of radiation absorbing layer 16. In another process embodiment, as illustrated in FIG. 5, only a portion of radiation absorbing layer 16 is removed by the etching process. Instead of completely removing portions of radiation absorbing layer 16 exposed by lithographic mask 18, the etching process is controlled, such that only a portion of radiation absorbing layer 16 is removed, leaving a region 20 of radiation absorbing layer 16 having a reduced thickness.

Figure 6:
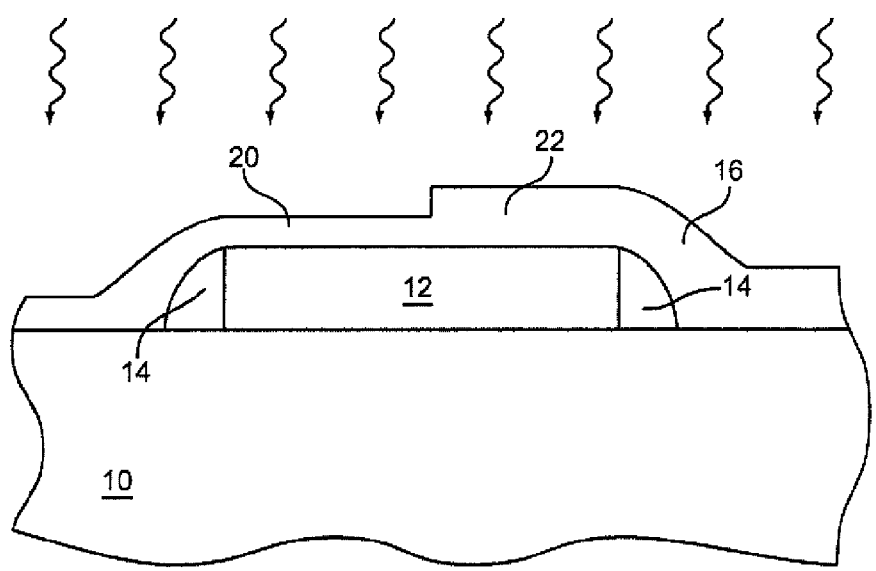

As illustrated in FIG. 6, upon removal of lithographic mask 18, device structure 12 is covered by a radiation absorbing layer having a variation in thickness over different portions of device structure 12. Upon irradiating device structure 12, a spatial variation in electrical conductivity characteristics of device structure 12 will be realized. The energy transmitted though radiation absorbing layer 16 substantially corresponds to the thickness variation of radiation absorbing layer 16. Accordingly, the spatial variation in thickness of radiation absorbing layer 16 will result in a corresponding spatial variation in the energy transmitted to underlying device structure 12. In the illustrated embodiment, higher radiation energy will be transmitted to portions of device structure 12 underlying region 20 as compared to portions of device structure 12 underlying region 22.

The radiation energy can be directed to device structure 12 from a flash annealing source, or a laser annealing source, or the like. The radiation source provides a relatively uniform radiation field that is attenuated by radiation absorbing layer 16. In one embodiment, a laser annealing process is carried out to activate the conductivity-determining dopants in device structure 12. For example, the laser annealing apparatus produces electromagnetic radiation having a wavelength ranging between about 600 nm to about 1000 nm. Radiation absorbing layer 16 is initially deposited to a thickness of about 0.2 nm to about 2500 nm. In one embodiment, upon the partial etching of radiation absorbing layer 16, region 20 has a thickness of about 0.1 nm to about 1250 nm.

Figure 7:
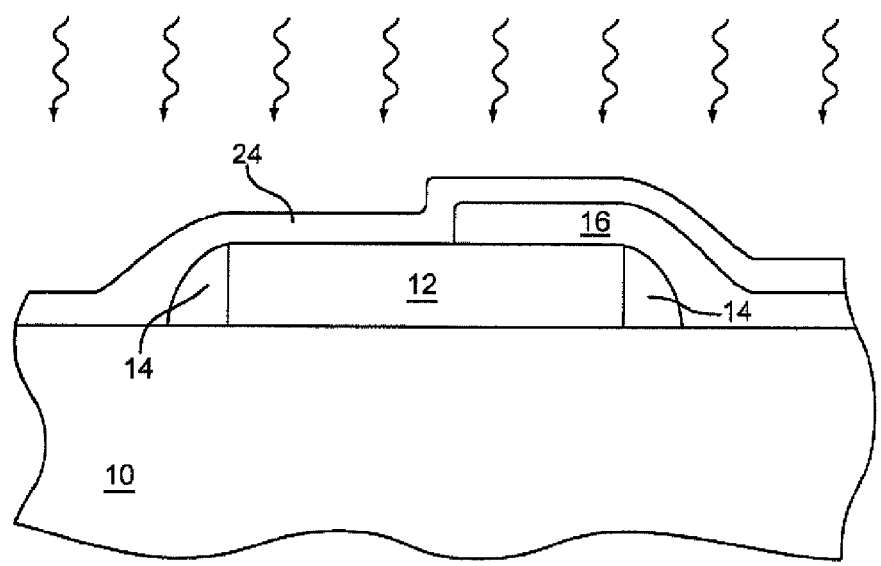

In a process variation, portions of radiation absorbing layer 16 exposed by lithographic mask 18 are completely etched away exposing the upper surface of device structure 12 underlying the etched portions of radiation absorbing layer 16. Then, as illustrated in FIG. 7, a second deposition process is carried out to form a second radiation absorbing layer 24. Second radiation absorbing layer 24 can be a material that differs from radiation absorbing layer 16 or, alternatively, the same material as layer 16.

In similarity with the preceding process technique, device structure 12 is irradiated through absorbing layers 16 and 24 to activate conductivity-determining dopants in device structure 12. The radiation energy intensity is attenuated by radiation absorbing layers 16 and 24, such that a spacial variation in electrical conductivity is imparted to device structure 12. Second radiation absorbing layer 24 can be, for example, amorphous carbon including hydrogen and additional species as previously described or, alternatively, layer 24 can be a different material, such as silicon nitride or silicon oxide, or the like.

Figure 8:
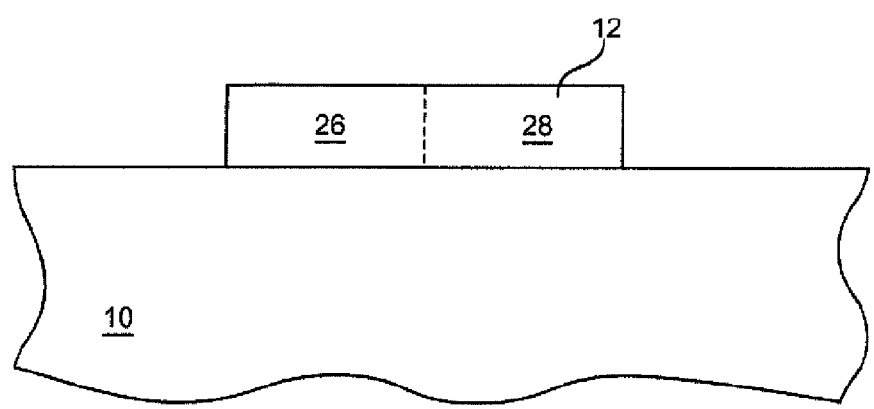

Upon irradiating device structure 12 and removal of radiation absorbing layers, device structure 12 includes regions having different electrical conductivity. As illustrated in FIG. 8, the variation in radiation absorbance by the one or more radiation absorbing layers forms a region 26 and a region 28 in device structure 12. The electrical sheet resistance (Rs) differs between regions 26 and 28 of device structure 12. For example, because of the increased energy imparted to region 26, a high degree of dopant activation takes place in region 26. Correspondingly, because of the relatively lower radiation energy imparted in region 28, a reduced level of dopant activation occurs in region 28. Accordingly, the electrical resistance of region 26 is less than the electrical resistance of region 28.

Using the foregoing process, a sheet resistor having a predetermined, uniform layout on substrate 10 is fabricated having a variation in sheet resistance. Accordingly, a range of sheet resistance can be obtained that is independent of the plane geometry or material volume of the resistor on substrate 10. Since the overall sheet resistance of device structure 12 will have a value that corresponds to the average of the electrical conductivity in regions 26 and 28, the overall sheet resistance is determined by the variation in absorbance of the radiation absorbing layer. As previously described, although the present illustrative embodiment forms regions of various electrical resistance having approximately the same volume, numerous variations in the resistance variations within device structure 12 are possible.

Figure 9:
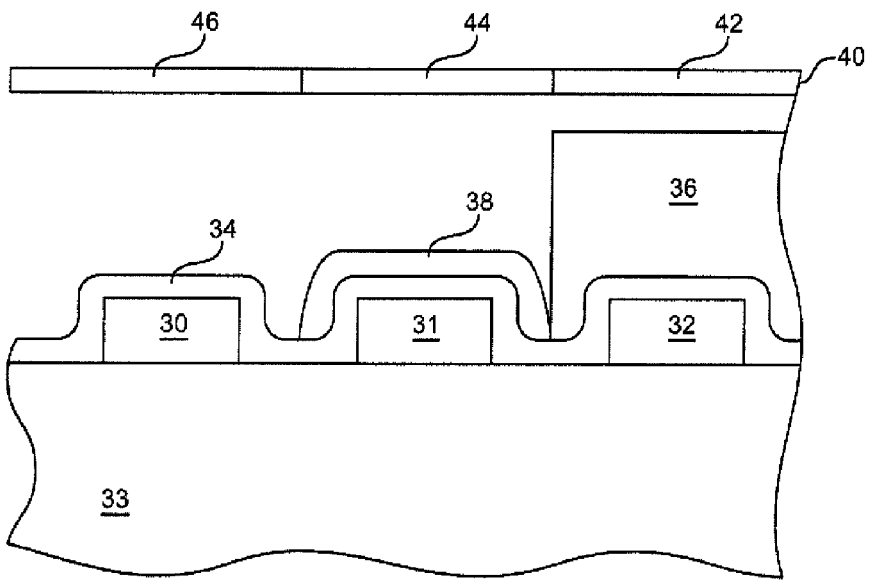
FIGS. 9-10 illustrate, and cross-section, processing steps in accordance with another embodiment of the invention.
Figure 10:
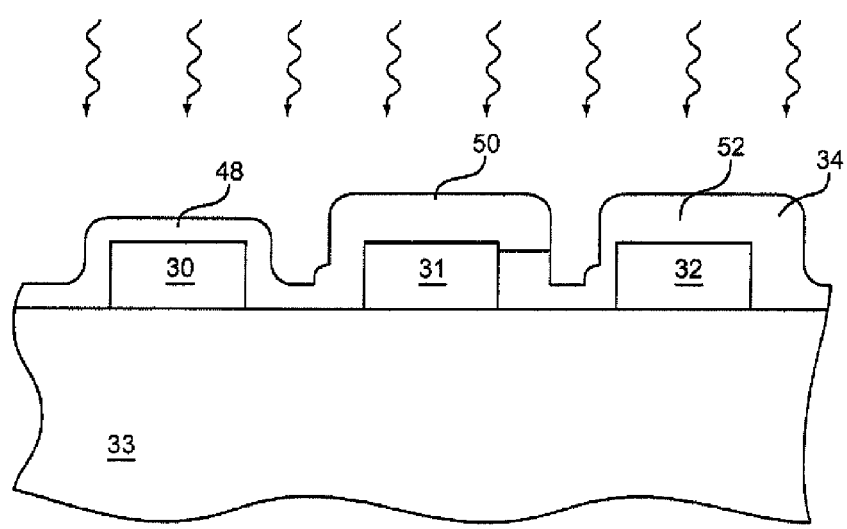

A process in accordance of another embodiment of the invention is illustrated in FIGS. 9 and 10. In the illustrated embodiment, a plurality of resistors 30, 31, and 32 are formed on a substrate 33. In one aspect, the resistors are all sized to substantially the same dimension. Accordingly, each of resistors is formed by approximately the same volume of semiconductor material. A radiation absorbing layer 34 overlies the resistors and substrate 33. Processing steps are carried out to form different lithographic masks over each of the resistors, where each of the masks has different etching resistance. For example, a blocking mask 36 is formed over resistor 32 and a tri-tone mask is formed over adjacent resistor 31. Resistor 30 is free of any overlying lithographic masking material. Alternatively, resistor 30 can have a completely transparent layer (not shown) overlying the radiation absorbing layer 34. The various mask structures are formed by depositing a layer of resist overlying radiation absorbing layer 34 and exposing the resist layer with an exposure mask having regions of different transmission characteristics. For example, exposure mask 40 includes a blocking region 42, a tri-tone region 44 and an open region 46. Upon exposure of the resist through exposure mask 40, and carrying out a resist development process, a relatively thick blocking mask 36 and partial mask 38 are formed over radiation absorbing layer 34.

After forming masks 36 and 38, an etching process is carried out to etch portions of radiation absorbing layer 34. Since mask 38 is formed to a relatively small thickness, mask 38 erodes during the etching process. Once mask 38 is completely eroded, the etching process attacks portions of radiation absorbing layer 34 underlying mask 38. Correspondingly, because blocking mask 36 is formed to a large thickness, mask 36 protects underlying portions of radiation absorbing layer 34 from the etching process. Accordingly, portions of radiation absorbing layer 34 underlying blocking mask 36 are substantially unetched. Further, since a mask is not formed over the remaining resistor 30, a portion of radiation absorbing layer 34 is fully exposed to the etching process.

Referring to FIG. 10, upon completion of the etching process and removal of mask 36 and 38, radiation absorbing layer 34 has a spatial thickness variation. A first region 48 overlies resistor 30, a second region 50 overlies resistor 31, and a third region 52 overlies resistor 32. Upon irradiating resistors 30, 31, and 32, each resistor will have a different resistor value that corresponds to the radiation intensity attenuation provided by radiation absorbing layer 34. The highest level of dopant activation and, hence the lowest resistance value, will be created in resistor 30. Correspondingly, relatively higher resistance values will be created in resistors 31 and 32, because of the relative increase in thickness of radiation absorbing layer 34 overlying these resistors.

By way of the process described above, resistors having substantially the same size will have a variation in resistance values depending upon the spatial absorbance characteristics of the radiation absorbing layer. By decoupling the sheet resistance values from resistors having substantially the same size, a great deal of flexibility is provided to device designers in the layout of resistors in various semiconductor devices, such as integrated circuits, memory devices, logic devices, and the like. Those skilled in the art will appreciate that the processing techniques disclosed herein can be applied to the fabrication of transistor components. For example, in FIG. 10, resistors 30, 31, and 32 can be gate electrodes of adjacent MOS transistors. In accordance with the inventive process, each gate electrode can have a different electrical conductivity depending upon the spatial variation and absorbance characteristics of the radiation absorbing layer. Further, the structure illustrated in device 10 can represent adjacent capacitor plates that capacitively couple with different regions of a semiconductor device.

Thus, it is apparent that there has been described a method for fabricating device structures having a variation in electrical conductivity that fully provides the advantages set forth above. Those skilled in the art will recognize that numerous modifications and variations can be made without departing from the spirit of the invention. For example, a wide variety of irradiation methods can be used, such as rapid-thermal-annealing (RTA), pulsed laser annealing, and the like. Further, numerous different etching processes, such as electronic-cyclotron-resonance (ECR) etching processes, and the like, can be carried out. Moreover, in addition to various type of lithographic masks, such as deep UV and X-ray masks, hard masks can also be used as etching masks in the disclosed etching processes. Accordingly, all such variations and modifications are within the scope of dependent claims and equivalents thereof.

The invention claimed is:

1. A method for fabricating a semiconductor device comprising:

forming a device structure;
forming a radiation absorbing layer comprising a layer of hydrogen impregnated amorphous carbon material or a carbon-hydrogen material incorporating additional species and forming a mask on the radiation absorbing layer and etching at least a portion of the radiation absorbing layer using the resist mask as an etching mask to form a layer having a continuous spatial variation in radiation absorbance overlying the device structure;
irradiating the device structure,
wherein the radiation absorbing layer imparts a spatial variation in electrical conductivity to the device structure substantially corresponding to the spatial variation in absorbance of the radiation absorbing layer,
such that the electrical conductivity of the device structure is independent of its physical dimensions.

2. The method of claim 1, wherein forming a radiation absorbing layer having a continuous spatial variation in absorbance comprises forming a radiation absorbing layer having a thickness variation over the device structure.

3. The method of claim 2, wherein forming a radiation absorbing layer having a thickness variation over the device structure comprises forming a mask pattern on a portion of the radiation absorbing layer and removing all or a portion of the radiation absorbing layer exposed by the mask pattern.

4. The method of claim 2, wherein forming a radiation absorbing layer having a thickness variation over the device structure comprises forming the mask to have a spatial variation in etching characteristics on the radiation absorbing layer and etching the mask and portions of the radiation absorbing layer.

5. The method of claim 4, wherein forming the mask to have a spatial variation in etching characteristics comprises forming the mask to have regions of differing thicknesses.

6. The method of claim 4 further comprising etching the mask and the radiation absorbing layer, such that a remaining thickness of the radiation absorbing layer varies in relation to the spatial variation in etching characteristics of the mask.

7. The method of claim 1, wherein forming a radiation absorbing layer having a variation in absorbance further comprises removing a portion of the radiation absorbing layer over the device structure and forming a second radiation absorbing layer on the device structure, such that at least two regions are formed in the device structure having different electrical conductivty.

8. The method of claim 7, wherein forming a second radiation absorbing layer comprises forming a layer having a composition that differs from a removed portion of the radiation absorbing layer.

9. The method of claim 1, wherein irradiating the device structure comprises laser annealing the device structure.

10. The method of claim 1, wherein forming a device structure comprises forming a sheet resistor.

11. The method of claim 10, wherein imparting a variation in electrical conductivity of the device structure comprises imparting a variation in sheet resistance of the sheet resistor.

12. The method of claim 1, wherein forming a device structure comprises forming a plurality of sheet resistors, wherein at least two of the plurality of sheet resistors have different sheet resistance values.

13. The method of claim 1, wherein forming a device structure comprises forming a portion of a transistor.

14. The method of claim 1, wherein irradiating comprises flash annealing the device structure.

15. A method for forming device structures having a variation in electrical conductivity, the method comprising:
forming a plurality of device structures having substantially the same area dimensions;
forming a radiation absorbing layer comprising a layer of homogeneous material;
forming a mask on the radiation absorbing layer and etching at least a portion of the radiation absorbing layer using the resist mask as an etching mask to form a layer having a continuous spatial variation in absorbance overlying the device structures; and
imparting electrical conductivity to the device structures,
wherein the electrical conductivity of at least two device structures differs in accordance with the spatial variation in absorbance of the radiation absorbing layer.

16. The method of claim 15, wherein imparting electrical conductivity comprises irradiating the device structures and annealing the device structures.

17. The method of claim 15, wherein etching the radiation absorbing layer comprises forming a radiation absorbing layer having a differing thickness over each of the at least two device structures.

18. The method of claim 17, wherein forming mask seven of this paper comprises forming a resist mask having regions of differing thickness over each of the at least two device structures.

19. The method of claim 15, wherein forming a plurality of device structures comprises forming a plurality of sheet resistors.

20. A method for fabricating sheet resistors comprising:
defining sheet resistors on a semiconductor substrate, wherein the sheet resistors are located intermediate to transistor gate electrodes and source and drain regions;
forming a radiation absorbing layer and forming a mask on the radiation absorbing layer and etching at least a portion of the radiation absorbing layer using the resist mask as an etching mask to form a layer having a spatial variation in absorbance overlying the resistors;
irradiating the resistors through the radiation absorbing layer; and
wherein the electrical resistivity of the resistors varies in substantial correspondence with the spatial variation in absorbance of the radiation absorbing layer, such that sheet resistance values of the sheet resistors are substantially independent of their surface area.

21. The method of claim 20, wherein defining sheet resistors comprises forming resistor structures and doping the resistor structures with a conductivity-determining dopant.

22. The method of claim 21, wherein irradiating the sheet resistors comprises laser annealing.

23. The method of claim 20, wherein defining resistors comprises forming a standardized uniform resistor size on the semiconductor substrate, and wherein at least two of the resistors have differing resistance values.

24. The method of claim 20, wherein forming a radiation absorbing layer comprises forming a carbon-hydrogen material incorporating additional species, the additional species comprising one or more of nitrogen, boron, phosphorus, and fluorine.

* * * * *